(12) United States Patent
Oshima et al.

(10) Patent No.: US 7,612,127 B2
(45) Date of Patent: Nov. 3, 2009

(54) CURABLE RESIN COMPOSITION

(75) Inventors: Kazuhiro Oshima, Machida (JP); Yoichi Ogata, Machida (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 457 days.

(21) Appl. No.: 10/583,449

(22) PCT Filed: Dec. 21, 2004

(86) PCT No.: PCT/JP2004/019118

§ 371 (c)(1),
(2), (4) Date: Jun. 19, 2006

(87) PCT Pub. No.: WO2005/061615

PCT Pub. Date: Jul. 7, 2005

(65) Prior Publication Data

US 2007/0142528 A1   Jun. 21, 2007

(30) Foreign Application Priority Data

Dec. 22, 2003   (JP) .............................. 2003-424175

(51) Int. Cl.
  *C08K 3/22*   (2006.01)
  *C08G 59/40*  (2006.01)
(52) U.S. Cl. ........................ 523/223; 524/430; 524/560
(58) Field of Classification Search ................. 523/223; 524/430
See application file for complete search history.

(56) References Cited

U.S. PATENT DOCUMENTS

| 4,560,712 A | 12/1985 | Chiang |
| 5,470,413 A | 11/1995 | Cedarleaf |
| 5,700,853 A | 12/1997 | Yoshida et al. |
| 2003/0032707 A1* | 2/2003 | Hemmings et al. .......... 524/425 |

FOREIGN PATENT DOCUMENTS

| DE | 199 21 876 A1 | 6/2000 |
| EP | 361109 A1 * | 4/1990 |
| JP | 54-28178 | 9/1979 |
| JP | 2001-139733 | 5/2001 |
| JP | 2001139733 A * | 5/2001 |
| JP | 2002-308919 | 10/2002 |
| JP | 2002308919 A * | 10/2002 |
| JP | 2003-342021 | 12/2003 |
| WO | WO 94/13464 | 6/1994 |

* cited by examiner

*Primary Examiner*—David Wu
*Assistant Examiner*—Satya B Sastri
(74) *Attorney, Agent, or Firm*—Oblon, Spivak, McClelland, Maier & Neustadt, L.L.P.

(57) ABSTRACT

It is to provide a curable resin composition which is curable at room temperature, has fluidity, is excellent in workability and provides a cured product having high thermal conductivity and being excellent in flexibility.

A curable resin composition comprising a (meth)acrylate monomer, an organic peroxide, a decomposition accelerator for the organic peroxide, and an inorganic filler, wherein the inorganic filler has a particle size distribution such that it has peak diameters at least in the respective regions of from 3 to 10 μm and from 30 to 70 μm, and the mode diameter is from 30 to 70 μm and the median diameter is from 5 to 40 μm.

20 Claims, No Drawings

CURABLE RESIN COMPOSITION

TECHNICAL FIELD

The present invention relates to a curable resin composition applicable to a potting material to seal electronic components and an adhesive to be used for bonding e.g. heat spreaders and heatsinks in semiconductor packages. Particularly, it relates to a curable resin composition which is excellent in fluidity even when it contains an inorganic filler and is curable at room temperature without heating, which provides a cured product being flexible and having high thermal conductivity, and is thereby applicable to potting materials and adhesives.

BACKGROUND ART

Potting treatment and the like by e.g. an epoxy resin or a silicone resin have been widely employed for the purpose of insulation, moisture-proofing, water-proofing, or vibration-proofing for electronic components. Further, along with e.g. downsizing, increase in density and increase in power of electronic components in recent years, as a potting material therefor, e.g. an epoxy resin and a silicone resin into which an inorganic filler having thermal conductivity such as silica or alumina is incorporated for the purpose of releasing heat generated from the electronic components, have been used. Further, for semiconductor packages also, a means for heat dissipation has been employed by bonding heat spreaders or heatsinks for the purpose of protecting e.g. IC chips from heat generation. Similarly, along with downsizing and increase in density of electronic components, bonding by an adhesive, not by screws, has been carried out, and as the adhesive, e.g. an epoxy resin and a silicone resin having thermal conductivity have been used.

An epoxy resin into which an inorganic filler is incorporated has excellent heat insulation properties and water resistance, but its cured product has a very high modulas, whereby a stress is likely to be applied to e.g. components by e.g. heat shock, which may cause cracks or separation. Further, in the case of a two part epoxy resin, there is a risk of insufficient curing if the blend ratio of the curing agent is mistaken. On the other hand, in the case of a one part epoxy resin, a heating apparatus is required in many cases and the curing time tends to be long, such being disadvantageous in view of further labor saving and energy saving and shortening of operation time.

Further, a silicone resin has been known as a RTV (room temperature vulcanizable) rubber, and its cured product has low hardness and is excellent in low temperature resistance and heat resistance. However, a silicone resin has such drawbacks that a low molecular siloxane contained as an impurity may cause continuity failure or abrasion of electric contacts, and is expensive also.

On the other hand, heretofore, an acrylic resin has been widely used in the field of molding materials, coatings and adhesives by virtue of having good durability and being environmentally friendly. Such an acrylic resin may be obtained in such a manner that an organic peroxide as a polymerization initiator is added to an acrylic monomer or oligomer, and radicals are generated by thermolysis of the organic peroxide to polymerize the acrylic monomer or oligomer.

An acrylic resin is characterized in that it is generally less extendable and its cured product is hard. Further, if an inorganic filler is incorporated, it will have a high modulas in the same manner as an epoxy resin and be poor in heat cycle resistance. However, in recent years, by e.g. use of an acrylic monomer to impart flexibility, an acrylic resin being flexible and having a low modulas equal to a silicone resin has been developed.

However, even with respect to such an acrylic resin having flexibility imparted, if an inorganic filler to impart thermal conductivity is incorporated in a large amount, the viscosity tends to increase, and when an electronic component is sealed or bonded, workability tends to be poor and it cannot sufficiently infiltrate into the component, or the sealed or bonded resin itself may contain bubbles, and no sufficient heat dissipation properties can be secured (Patent Documents 1 and 2).

Patent Document 1: JP-B-54-28178
Patent Document 2: JP-A-2002-308919

DISCLOSURE OF THE INVENTION

Object to be Accomplished by the Invention

As described above, development of a potting material and an adhesive which have higher fluidity and good workability as compared with conventional potting material and adhesive, have high thermal conductivity and moderate hardness, and provide a cured product excellent in heat cycle resistance, have been desired.

The present invention is to provide a curable resin composition having thermal conductivity with which heat generated from electronic components can be released, which is curable at room temperature and which has fluidity, and a potting material and an adhesive excellent in workability which are made of the curable resin composition, thereby to dissolve the problems of the above prior art.

MEANS TO ACCOMPLISH THE OBJECT

The present invention provides a curable resin composition comprising a (meth)acrylate monomer, an organic peroxide, a decomposition accelerator for the organic peroxide, and an inorganic filler, wherein the inorganic filler has a particle size distribution such that it has peak diameters at least in the respective regions of from 3 to 10 μm and from 30 to 70 μm, and the mode diameter is from 30 to 70 μm and the median diameter is from 5 to 40 μm; the curable resin composition wherein the inorganic filler has a particle size distribution such that it has peak diameters at least in the respective regions of from 0.2 to 1.5 μm, from 3 to 10 μm and from 30 to 70 μm, the mode diameter is from 30 to 70 μm and the medium diameter is from 5 to 40 μm; the curable resin composition which comprises from 0.5 to 10 parts by mass of the organic peroxide, from 0.1 to 10 parts by mass of the decomposition accelerator and from 100 to 1,500 parts by mass of the inorganic filler, respectively, per 100 parts by mass of the (meth)acrylate monomer; the curable resin composition further containing a drying oil, which comprises from 1 to 30 parts by mass of the drying oil, from 0.5 to 10 parts by mass of the organic peroxide, from 0.1 to 10 parts by mass of the decomposition accelerator and from 100 to 1,500 parts by mass of the inorganic filler, respectively, per 100 parts by mass of the (meth)acrylate monomer; the curable resin composition, wherein the inorganic filler is spherical alumina; and a cured product, a potting material and an adhesive, each made of the above curable resin composition.

EFFECTS OF THE INVENTION

The curable resin composition of the present invention has fluidity and is excellent in workability and further, it is curable at room temperature and is thereby advantageous in labor saving, energy saving and shortening of operation time. Further, its cured product has thermal conductivity with which heat generated from electronic components can be sufficiently released, and is flexible and has low modulas, and has favorable heat cycle resistance, and is thereby excellent in environmental resistance.

BEST MODE FOR CARRYING OUT THE INVENTION

The (meth)acrylate monomer contained in the curable resin composition of the present invention is a methacrylate or acrylate (hereinafter referred to as (meth)acrylate) monomer, and specifically, it may, for example, be methyl(meth)acrylate, ethyl(meth)acrylate, propyl(meth)acrylate, butyl (meth)acrylate, 2-ethylhexyl (meth)acrylate, isooctyl(meth)acrylate, isodecyl (meth)acrylate, lauryl(meth)acrylate, stearyl (meth)acrylate, phenyl(meth)acrylate, cyclohexyl (meth)acrylate, dicyclopentanyl(meth)acrylate, dicyclopentenyl(meth)acrylate, dicyclopentenyloxyethyl (meth)acrylate, isobornyl(meth)acrylate, methoxylated cyclodecatrien (meth)acrylate, 2-hydroxyethyl (meth)acrylate, 2-hydroxypropyl(meth)acrylate, 3-hydroxypropyl(meth)acrylate, 4-hydroxybutyl (meth)acrylate, polyethylene glycol mono (meth)acrylate, polypropylene glycol mono(meth)acrylate, alkyloxy polyethylene glycol mono(meth)acrylate, alkyloxy polypropylene glycol mono(meth)acrylate, tetrahydrofurfuryl(meth)acrylate, 2-hydroxy-3-phenoxypropyl(meth)acrylate, glycidyl(meth)acrylate, caprolactone modified tetrahydrofurfuryl(meth)acrylate, 3-chloro-2-hydroxypropyl(meth) acrylate, N,N-dimethylaminoethyl (meth)acrylate, N,N-diethylaminoethyl (meth)acrylate, t-butylaminoethyl(meth)acrylate, morpholine (meth)acrylate, ethoxycarbonylmethyl (meth)acrylate, phenol ethylene oxide modified acrylate, phenol (ethylene oxide 2 mol modified) acrylate, phenol (ethylene oxide 4 mol modified) acrylate, p-cumylphenol ethylene oxide modified acrylate, nonylphenol ethylene oxide modified acrylate, nonylphenol (ethylene oxide 4 mol modified) acrylate, nonylphenol (ethylene oxide 8 mol modified) acrylate, nonylphenol (propylene oxide 2.5 mol modified) acrylate, 2-ethylhexylcarbitol acrylate, polyglycerol di(meth)acrylate, polybutylene glycol di(meth)acrylate, 1,4-butanediol (meth)acrylate, 1,6-hexanediol (meth)acrylate, neopentyl glycol di(meth)acrylate, trimethylolpropane tri (meth)acrylate, (meth)acrylate of ethylene oxide modified phthalic acid, (meth)acrylate of ethylene oxide modified succinic acid, trifluoroethyl(meth)acrylate, tetrafluoropropyl (meth)acrylate, 1,2-polybutadiene terminal urethane modified di(meth)acrylate, polyacrylonitrile butadiene methacrylate, 2,2-bis(4-(meth)acryloxydiethoxyphenyl)propane, 2,2-bis(4-(meth)acryloxypropoxyphenyl)propane, 2,2-bis(4-(meth)acryloxytetraethoxyphenyl)propane, epoxy acrylate, urethane acrylate or polyester (meth)acrylate.

Among them, a (meth)acrylate monomer having at least one phenyl group in its molecule is particularly preferred as the (meth)acrylate monomer to be contained in the curable resin composition of the present invention, since a homopolymer of the (meth)acrylate monomer has an elongation of at least 200% at 20° C.

Specifically, the (meth)acrylate monomer may, for example, be preferably 2-hydroxy-3-phenoxypropyl acrylate, phenol ethylene oxide modified acrylate, p-cumylphenol ethylene oxide modified acrylate or nonylphenol ethylene oxide modified acrylate.

Further, another particularly preferred (meth)acrylate monomer to be contained in the curable resin composition of the present invention is a (meth)acrylate monomer having at least one phenyl group in its molecule, which provides a homopolymer of the (meth)acrylate monomer having a glass transition temperature of at most 0° C.

Specifically, another (meth)acrylate monomer may, for example, be preferably phenol (ethylene oxide 2 mol modified) acrylate, phenol (ethylene oxide 4 mol modified) acrylate, nonylphenol (ethylene oxide 2 mol modified) acrylate, nonylphenol (ethylene oxide 4 mol modified) acrylate, nonylphenol (ethylene oxide 8 mol modified) acrylate, nonylphenol (propylene oxide 2.5 mol modified) acrylate, nonylphenoxypolyethylene glycol methacrylate, nonylphenoxypolypropylene glycol methacrylate, nonylphenoxypoly(ethylene glycol-polypropylene) methacrylate, phenoxyethyl acrylate or phenoxyethyl methacrylate.

These (meth)acrylate monomers may be used alone or as a mixture of at least two for the purpose of adjusting adhesive properties, curing properties and physical properties of a cured product.

In the curable resin composition of the present invention, the (meth)acrylate monomer having at least one phenyl group in its molecule, which provides a homopolymer of the (meth)acrylate monomer having an elongation of at least 200% at 20° C., is a component which makes a cured product be flexible and which imparts elongation properties. This (meth)acrylate monomer is contained preferably in an amount of at least 10 mass % in 100 mass % of all the (meth)acrylate monomers.

In the curable resin composition of the present invention, the (meth)acrylate monomer having at least one phenyl group in its molecule, which provides a homopolymer of the (meth)acrylate monomer having a glass transition temperature of at most 0° C., is a component which makes flexibility of a cured product be maintained even at low temperature. This (meth)acrylate monomer is contained preferably in an amount of at least 20 mass % in 100 mass % of all the (meth)acrylate monomers.

In the curable resin composition of the present invention, a drying oil will bring chain transfer at the site of radical polymerization of the (meth)acrylate monomer, be incorporated in the polymer and form crosslinks. Further, the drying oil has such a function that a peroxide is formed by the action of the air, which is decomposed by a decomposition accelerator for the organic peroxide to form free radicals, thereby to polymerize a monomer, i.e. so-called air-curing properties.

A compound having air-curing properties may, for example, be a dicyclopentenyl(meth)acrylate monomer, a dicyclopentenyloxyethyl(meth)acrylate monomer, a dicyclopentadiene resin or a (meth)acrylate modified polybutadiene. However, each of them will drastically increase the modulas, and none of them can be added in an amount in which the air-curing properties can be obtained.

Accordingly, the drying oil is a component required to impart air-curing properties, in addition to making the curable resin composition of the present invention be a flexible resin.

The drying oil to be used in the present invention is a glycerol ester of an unsaturated fatty acid, such as linseed oil, boiled oil or fish oil.

The content of the drying oil is preferably higher in view of flexibility and air-curing properties, but if it is too high, chain transfer will occur at the time of radical polymerization, whereby the molecular weight of a (meth)acrylic resin to be obtained will decrease, which may cause a decrease in strength. Accordingly, a preferred blending amount is from 1 to 30 parts by mass, particularly preferably from 3 to 20 parts by mass, per 100 parts by mass of the (meth)acrylate monomer.

If the content of the drying oil is less than 1 part by mass, the surface drying effect will be insufficient, and the inorganic filler incorporated will not be maintained in the interior of a cured product and will come to the surface to be in contact with the air of the cured product, such being unfavorable.

The organic peroxide to be used as a polymerization initiator for the curable resin composition of the present invention may, for example, be a hydroperoxide such as tert-butyl hydroperoxide, cumene hydroperoxide, diisopropylbenzene hydroperoxide, p-menthane hydroperoxide, 2,5-dimethylhexane-2,5-dihydroperoxide or 1,1,3,3-tetramethylbutyl hydroperoxide, a ketone peroxide such as methyl ethyl ketone peroxide, cyclohexanone peroxide, 3,3,5-trimethylcyclohexanone peroxide, methylcyclohexanone peroxide, methylacetoacetate peroxide or acetylacetone peroxide, or a diacyl peroxide such as acetyl peroxide, isobutyl peroxide, octanoyl peroxide, decanoyl peroxide, lauronyl peroxide, 3,3,5-trimethylhexanoyl peroxide, succinic acid peroxide, benzoyl peroxide, 2,4-dichlorobenzoyl peroxide or m-toluoyl peroxide.

These organic peroxides may be used alone or in combination of two or more of them.

The amount of the organic peroxide used is preferably from 0.5 to 10 parts by mass per 100 parts by mass of the (meth) acrylate monomer. If it is less than 0.5 part by mass, curing will be insufficient, and if it exceeds 10 parts by mass, adhesive properties will rather decrease, storage stability will remarkably decrease and further, skin irritativeness will be intense, such being unfavorable.

The decomposition accelerator for the organic peroxide of the present invention may, in the case of using as the organic peroxide a hydroperoxide or a ketone peroxide, for example, be a metal salt of an organic acid or an organic metal chelate, such as cobalt naphthenate, copper naphthenate, manganese naphthenate, cobalt octanoate, copper octanoate, manganese octanoate, copper acetylacetonate, titanium acetylacetonate, manganese acetylacetonate, chromium acetylacetonate, iron acetylacetonate, vanadium acetylacetonate or cobalt acetylacetonate.

Further, another decomposition accelerator for the organic peroxide may, for example, be a thiourea derivative such as diethylthiourea, dibutylthiourea, ethylenethiourea, tetramethylthiourea, mercaptobenzoimidazole or benzoylthiourea.

Further, in a case where a dyacyl peroxide such as benzoyl peroxide is used as the organic peroxide, the decomposition accelerator for the organic peroxide may, for example, be an amine such as N,N-dimethyl-p-toluidine, N,N-diethyl-p-toluidine, N,N-di(2-hydroxyethyl)-p-toluidine, N,N-diisopropanol-p-toluidine, triethylamine, tripropylamine, ethyldiethanolamine, N,N-dimethylaniline, ethylenediamine, triethanolamine or an aldehyde-amine condensation product.

These decomposition accelerators for the organic peroxide may be used alone or in combination of two or more of them.

The amount of the decomposition accelerator for the organic peroxide in the present invention is preferably from 0.1 to 10 parts by mass per 100 parts by mass of the (meth) acrylate monomer. If it is less than 0.1 part by mass, curing tends to be insufficient, and if it exceeds 10 parts by mass, adhesive properties may decrease or storage stability may decrease.

Particles of the inorganic filler to be used for the curable resin composition of the present invention are required to have a particle size distribution such that it has peak diameters at least in the respective regions of from 3 to 10 µm and from 30 to 70 µm, and the mode diameter is from 30 to 70 µm and the medium diameter is from 5 to 40 µm. More preferably, they have a particle size distribution such that it has peak diameters at least in the respective regions of from 0.2 to 1.5 µm, from 3 to 10 µm and from 30 to 70 µm, and the mode diameter is from 30 to 70 µm and the medium diameter is from 5 to 40 µm.

Particles of the inorganic filler showing a peak diameter in a region of from 30 to 70 µm are particles to be nuclei when the inorganic filler is incorporated into the resin, and if the peak diameter is less than 30 µm, the viscosity of the curable resin composition will remarkably increase, and if it exceeds 70 µm, a coarse powder will undergo sedimentation apart from the (meth)acrylate monomer during storage or during potting of electronic components, or small spaces of the electronic components may be clogged with the coarse powder and it cannot penetrate to the electronic components. Further, particles showing a peak diameter in a region of from 3 to 10 µm can penetrate into spaces between particles showing a peak diameter in a region of from 30 to 70 µm and make a dense particle packing structure, whereby the viscosity can be decreased by the closest packing effect. By the particle size distribution having these two peak diameters simultaneously, a decrease in viscosity when the inorganic filler is incorporated at a high density, which has not been accomplished, can be achieved.

More preferably, the particle size distribution has, in addition to the above two peak diameters, a peak diameter in a region of from 0.2 to 1.5 µm. The particles showing a peak diameter in a region of from 0.2 to 1.5 µm can penetrate into spaces in the particle packing structure comprising particles showing a peak diameter in a region of from 30 to 70 µm and particles showing a peak diameter in a region of from 3 to 10 µm, and they can make a denser particle packing structure, whereby the viscosity of the curable resin composition can be more decreased.

The peak diameter in the present invention is a particle diameter showing a peak in the frequency particle size distribution of the inorganic filler. The mode diameter is the most frequent diameter among the peak diameters, and the medium diameter is a cumulative 50 wt % particle diameter in the cumulative particle size distribution. The particle size distribution can be measured by a laser diffraction light-scattering method.

The inorganic filler in the present invention may, for example, be an oxide such as spherical alumina, powdered alumina, magnesium oxide, beryllium oxide or titanium oxide; a nitride such as boron nitride, silicon nitride or aluminum nitride; a carbide such as silicon carbide; a hydrated metal such as aluminum hydroxide or magnesium hydroxide; a metal filler of e.g. copper, silver, iron, aluminum or nickel; a metal alloy filler of e.g. titanium, a carbon type filler of e.g. diamond or carbon; quartz, quartz glass, or a silica powder of e.g. fused silica or spherical silica. These inorganic fillers may be used alone or in combination of two or more of them. Among these inorganic fillers, particularly preferred is spherical alumina or spherical silica in view of availability and incorporation properties into the acrylic resin, and more preferably, spherical alumina is most suitable in view of thermal conductivity.

The amount of the inorganic filler of the present invention is preferably from 10 to 1,500 parts by mass per 100 parts by mass of the (meth)acrylate monomer. If it is less than 1 part by mass, no thermal conductivity will be imparted. If it exceeds 1,500 parts by mass, a mixture for the curable resin composition will be clayey and will have no fluidity, such being unfavorable from the viewpoint of workability and adhesive properties.

For the curable resin composition of the present invention, a small amount of a polymerization inhibitor may be used to improve the storage stability of the composition. The polymerization inhibitor may, for example, be methylhydroquinone, hydroquinone, 2,2-methylene-bis(4-methyl-6-tert-butylphenol), catechol, hydroquinone monomethyl ether, mono tert-butylhydroquinone, 2,5-di-tert-butylhydroquinone, p-benzoquinone, 2,5-diphenyl-p-benzoquinone, 2,5-di-tert-butyl-p-benzoquinone, picric acid, citric acid, phenothiazine, tert-butylcatechol, 2-butyl-4-hydroxyanisole or 2,6-di-tert-butyl-p-cresol.

The amount of the polymerization inhibitor is preferably from 0.001 to 3 parts by mass, more preferably from 0.01 to 2 parts by mass per 100 parts by mass of the (meth)acrylate monomer. If it is less than 0.001 part by mass, the storage stability will decrease, and if it exceeds 3 parts by mass, adhesive properties are likely to decrease, whereby the curable resin composition may be uncured.

For the curable resin composition of the present invention, a coupling agent may be used in combination for the purpose of improving fluidity. The coupling agent may, for example, be a silane coupling agent or a titanate coupling agent.

The silane coupling agent may, for example, be γ-chloropropyltrimethoxysilane, vinyltrimethoxysilane, vinyltrichlorosilane, vinyltriethoxysilane, vinyl-tris(β-methoxyethoxy) silane, γ-methacryloxypropyltrimethoxysilane, γ-acryloxypropyltrimethoxysilane, β-(3,4-epoxycyclohexyl) ethyltrimethoxysilane, γ-glycidoxypropyltrimethoxysilane, γ-mercaptopropyltrimethoxysilane, γ-aminopropyltriethoxysilane, N-β-(aminoethyl)-γ-aminopropyltrimethoxysilane, N-β-(aminoethyl)-γ-aminopropylmethyldimethoxysilane or γ-ureidopropyltriethoxysilane.

The titanate coupling agent may, for example, be isopropyltriisostearoyl titanate, isopropyltridecylbenzenesulfonyl titanate, isopropyltris(dioctylpyrophosphate) titanate, tetraisopropylbis(dioctylphosphite) titanate, tetraoctylbis(ditridecylphosphite) titanate, tetra(2,2-dialyloxy-1-butyl)bis (ditridecylphosphite) titanate, bis(dioctylpyrophosphate) oxyacetate titanate, bis(dioctylpyrophosphate)ethylene titanate, isopropyltrioctanoyl titanate, isopropyldimethacrylisostearoyl titanate, isopropylisostearoyldiacryl titanate, isopropylisotri(dioctylphosphate) titanate, isopropyltricumylphenyl titanate, isopropyltri(N-aminoethyl-aminoethyl)titanate, dicumylphenyloxyacetate titanate or diisostearoylethylene titanate.

The amount of the silane coupling agent or the titanate coupling agent used is preferably from 0.001 to 10 parts by mass per 100 parts by mass of the (meth)acrylate monomer. If it is less than 0.001 part by mass, no effect will be obtained, and if it exceeds 10 parts by mass, adhesive properties may decrease.

For the curable resin composition of the present invention, it is possible to use additives which are commonly used, such as an elastomer such as an acrylic rubber, a urethane rubber or an acrylonitrile-butadiene-styrene rubber, a solvent, a bulk filler, a reinforcing material, a plasticizer, a thickener, a chelating agent, a dye, a pigment, a fire retardant and a surfactant, within a range not to impair the object of the present invention.

The curable resin composition of the present invention is used usually by mixing the (meth)acrylate monomer, the drying oil, the organic peroxide, the decomposition accelerator for the organic peroxide and the inorganic filler with stirring. The curable resin composition of the present invention may be used as a one part or two part potting material or adhesive. For example, in the case of a one part type, preferred is a method of preliminarily mixing the (meth)acrylate monomer, the drying oil, the organic peroxide and the inorganic filler component, and adding the decomposition accelerator for the organic peroxide at the time of use. In the case of a two part type, for example, a method may be mentioned wherein a mixture of the (meth)acrylate monomer and the inorganic filler is divided to two parts, the organic peroxide is added to one part (component A) and the decomposition accelerator for the organic peroxide is added to the other part (component B), and the components A and B are mixed at the time of use. On that occasion, in order to secure the storage stability, the entire drying oil is preferably incorporated into the component A containing the organic peroxide.

EXAMPLES

Now, the present invention will be explained in further detail with reference to Examples. However, the present invention is by no means restricted to such specific Examples.

Example 1, Comparative Example 1

As an inorganic filler, 9 types of spherical alumina with different particle size distributions were prepared. The peak diameters of these spherical alumina powders in regions in the vicinity of from 0.2 to 1.5 μm, from 3 to 10 μm and from 30 to 70 μm are shown in Table 1.

TABLE 1

| Spherical alumina No. | Peak diameter (μm) in 0.2 to 1.5 μm | Peak diameter (μm) in 3 to 10 μm | Peak diameter (μm) in 30 to 70 μm | Mode diameter (μm) | Median diameter (μm) |
| --- | --- | --- | --- | --- | --- |
| I | 0.3 | 5.2 | 38.8 | 38.8 | 9.5 |
| II | 0.3 | 7.5 | 38.8 | 38.8 | 12.1 |
| III | 0.7 | 7.5 | 55.1 | 55.1 | 12.0 |
| IV | Nil | 5.2 | 38.8 | 38.8 | 23.5 |
| V | 0.7 | 5.1 | 76.1 | 76.1 | 35.9 |
| VI | 0.3 | 15.5 | 38.8 | 38.8 | 17.6 |
| VII | 0.1 | Nil | 38.8 | 38.8 | 35.3 |
| VIII | 0.3 | 5.2 | 25.7 | 25.7 | 11.9 |
| IX | 0.7 | 3.2 | 33.1 | 33.1 | 4.7 |

So as to evaluate properties of the curable resin composition having thermal conductivity of the present invention, a (meth)acrylic resin type liquid A comprising as 100 parts by mass in total of (meth)acrylate monomers, composed of 58% (mass %, the same applies hereinafter) of 2-hydroxy-3-phenoxypropyl acrylate (ARONIX M-5700 manufactured by TOAGOSEI CO., LTD), 10% of p-cumylphenol ethylene oxide modified acrylate (ARONIX M-110 manufactured by TOAGOSEI CO., LTD), 30% of nonylphenol ethylene oxide 4 mol modified acrylate (ARONIX M-113 manufactured by TOAGOSEI CO., LTD) and 2% of liquid partially hydrated polybutadiene having both terminals methacryl-modified (TEAI-1000 manufactured by Nippon Soda Co., Ltd.), and 6 parts by mass of linseed oil as a drying oil, 1.25 parts by mass of cumene hydroperoxide (manufactured by NOF CORPORATION) as an organic peroxide, 0.2 part by mass of 2-methylene-bis(4-methyl-6-tert-butylphenol) as a polymerization inhibitor and 2.5 parts by mass of γ-methacryloxypropyltrimethoxysilane (A-174 manufactured by Nippon Unicar Company Limited) as a silane coupling agent, was obtained.

Then, spherical alumina in a desired amount as identified in Table 1 per 100 parts by mass of the (meth)acrylate monomers in the (meth)acrylic resin type liquid A was blended by using a planetary mixer/deaerator (MAZERUSTAR KK-100 manufactured by KURABO INDUSTRIES LTD.) to obtain a (meth)acrylic resin type liquid B containing spherical alumina. To the spherical alumina-containing (meth)acrylic resin type liquid B, as a decomposition accelerator for the organic peroxide, cobalt octanoate (manufactured by Kanto Fine K.K.) was added in an amount of 1.25 parts by mass per 100 parts by mass of the (meth)acrylate monomers to obtain a curable resin composition C. Properties of the obtained material were evaluated in accordance with the following methods. The results are shown in Table 2 (Example 1) and Table 3 (Comparative Example 1).

TABLE 2

|  |  | Ex. 1 | | | | | |
|---|---|---|---|---|---|---|---|
|  | Sample No. | 1 | 2 | 3 | 4 | 5 | 6 |
|  | Spherical alumina No. | I | I | I | II | III | IV |
|  | Amount of alumina (parts by mass) | 400 | 280 | 600 | 400 | 400 | 400 |
| Evaluation results | Viscosity (mPa·s) | 8,000 | 3,500 | 13,000 | 9,200 | 6,800 | 9,100 |
|  | Curing time (min) | 50 | 45 | 55 | 52 | 50 | 50 |
|  | Modulus in tension (MPa) | 4.8 | 2.1 | 12 | 5.2 | 3.7 | 4.9 |
|  | Coefficient of thermal conductivity (W/m·K) | 2.2 | 1.5 | 3.2 | 2.1 | 2.3 | 2.1 |
|  | Tensile lap-shear strength (MPa) | 5.5 | 5.2 | 6.0 | 5.0 | 5.2 | 5.4 |

TABLE 3

|  |  | Ex. 1 | | | | |
|---|---|---|---|---|---|---|
|  | Sample No. | 7 | 8 | 9 | 10 | 11 |
|  | Spherical alumina No. | V | VI | VII | VIII | IX |
|  | Amount of alumina (parts by mass) | 400 | 400 | 400 | 400 | 400 |
| Evaluation results | Viscosity (mPa·s) | 39,000 | 65,000 | 103,000 | 35,000 | 93,000 |
|  | Curing time (min) | 50 | 53 | 52 | 46 | 45 |
|  | Modulus in tension (MPa) | 4.5 | 4.8 | 5.5 | 4.7 | 4.6 |
|  | Coefficient of thermal conductivity (W/m·K) | 2.1 | 2.0 | 2.3 | 1.9 | 1.9 |
|  | Tensile lap-shear strength (MPa) | 4.2 | 3.8 | 0.9 | 4.0 | 1.2 |

(Evaluation Methods)

Viscosity: The viscosity of the curable resin composition C was measured by using a Brookfield viscometer at a temperature of 23° C.

Curing time: The time after the curable resin composition C was obtained until it lost fluidity and became a cured product at a temperature of 23° C. was measured.

Modulas in tension: On a PET film, a frame punched out into a #1 dumbbell (JIS K7113) from a 2 mm thickness silicone rubber sheet was put, the curable resin composition C was cast, a PET film was placed thereon, followed by curing at a temperature of 23° C. for 3 days, and the obtained cured product was removed from the frame to prepare a #1 dumbbell test specimen. The modulas in tension of the prepared test specimen was measured by using a universal testing machine at a rate of pulling of 5 mm/min.

Coefficient of thermal conductivity: The coefficient of thermal conductivity of a cured product of the curable resin composition C was measured by a laser flash measuring apparatus.

Tensile lap-shear strength: Measured in accordance with JIS K6580. Specifically, using as adherends aluminum test specimens (100 mm×25 mm), two aluminum test specimens were bonded with an adhesion portion of 25 mm×12.5 mm in width by means of the curable resin composition C, followed by curing at a temperature of 23° C. for 24 hours to prepare a test specimen for evaluation of the tensile lap-shear strength. The tensile lap-shear strength of the prepared test specimen was measured by using a universal testing machine at a rate of pulling of 10 mm/min.

Example 2

As an inorganic filler, four types of spherical silica having different particle size distributions were prepared. The peak diameters of each spherical silica in regions in the vicinity of from 0.2 to 1.5 µm, from 3 to 10 µm and from 30 to 70 µm are shown in Table 4.

TABLE 4

| Spherical silica No. | Peak diameter (µm) in 0.2 to 1.5 µm | Peak diameter (µm) in 3 to 10 µm | Peak diameter (µm) in 30 to 70 µm | Mode diameter (µm) | Median diameter (µm) |
|---|---|---|---|---|---|
| i | 0.4 | 5.1 | 39.8 | 39.8 | 9.5 |
| ii | 0.7 | 7.5 | 55.1 | 55.1 | 12.0 |

TABLE 4-continued

| Spherical silica No. | Peak diameter (μm) in 0.2 to 1.5 μm | Peak diameter (μm) in 3 to 10 μm | Peak diameter (μm) in 30 to 70 μm | Mode diameter (μm) | Median diameter (μm) |
|---|---|---|---|---|---|
| iii | 0.3 | 15.5 | 38.8 | 38.8 | 17.6 |
| iv | 0.1 | Nil | 38.8 | 38.8 | 35.3 |
| v | 0.7 | 3.2 | 33.1 | 33.1 | 4.7 |

In order to evaluate properties of a curable resin composition employing spherical silica as an inorganic filler, to 100 parts by mass of the (meth)acrylate monomers in the (meth)acrylic resin type liquid A used in Example 1, spherical silica in an amount as identified in Table 4 was blended in the same manner as in Example 1 to obtain a (meth)acrylic resin type liquid D containing spherical silica. To the (meth)acrylic resin type liquid D, as a decomposition accelerator for the organic peroxide, cobalt octanoate was added in an amount of 1.25 parts by mass per 100 parts by mass of the (meth)acrylate monomers to obtain a curable resin composition E. Properties of the obtained material were evaluated in the same evaluation methods as in Example 1. The results are shown in Table 5 (Example 2) and Table 6 (Comparative Example 2).

TABLE 5

| | | Ex. 2 Sample No. | | | |
|---|---|---|---|---|---|
| | | 12 | 13 | 14 | 15 |
| Spherical silica No. | | i | i | ii | ii |
| Amount of silica (parts by mass) | | 220 | 300 | 220 | 300 |
| Evaluation results | Viscosity (mPa·s) | 6,700 | 9,700 | 5,000 | 8,900 |
| | Curing time (min) | 50 | 45 | 55 | 52 |
| | Modulus in tension (MPa) | 1.8 | 2.1 | 2.2 | 3.2 |
| | Coefficient of thermal conductivity (W/m·K) | 0.5 | 0.6 | 0.5 | 0.7 |
| | Tensile lap-shear strength (MPa) | 5.7 | 5.1 | 5.8 | 5.4 |

TABLE 6

| | | Comp. Ex. 2 Sample No. | | |
|---|---|---|---|---|
| | | 16 | 17 | 18 |
| Spherical silica No. | | iii | iv | v |
| Amount of silica (parts by mass) | | 220 | 220 | 220 |
| Evaluation results | Viscosity (mPa·s) | 36,000 | 53,000 | 48,000 |
| | Curing time (min) | 50 | 53 | 52 |
| | Modulus in tension (MPa) | 2.5 | 2.8 | 2.5 |
| | Coefficient of thermal conductivity (W/m·K) | 0.5 | 0.4 | 0.5 |
| | Tensile lap-shear strength (MPa) | 6.2 | 6.7 | 6.3 |

Example 3

A spherical alumina-containing (meth)acrylic resin type liquid F was obtained, comprising 100 parts by mass in total of (meth)acrylate monomers, composed of 58% of 2-hydroxy-3-phenoxypropyl acrylate, 10% of p-cumylphenol ethylene oxide modified acrylate, 30% of nonylphenol ethylene oxide 4 mol modified acrylate and 2% of liquid partially hydrated polybutadiene having both terminals methacryl-modified, and 1.25 parts by mass of cumene hydroperoxide as an organic peroxide, 0.2 part by mass of 2-methylene-bis(4-methyl-6-tert-butylphenol) as a polymerization inhibitor, 2.5 parts by mass of γ-methacyloxypropyltrimethoxysilane as a silane coupling agent and 300 parts by mass of spherical alumina I as identified in Table 1. Then, linseed oil as a drying oil in an amount as identified in Table 7 was sprinkled per 100 parts by mass of the acrylate monomers in the spherical alumina-containing (meth)acrylic resin type liquid F to obtain an alumina-containing (meth)acrylic resin type liquid G. To the (meth)acrylic type liquid G, as a decomposition accelerator for the organic peroxide, cobalt octanoate was added in an amount of 1.25 parts by mass per 100 parts by mass of the (meth)acrylate monomers to obtain a curable resin composition H. The obtained material H was applied on a PET film in a thickness of about 1 mm, and the surface drying state after 12 hours was observed. The results are shown in Table 7.

TABLE 7

| | Ex. 3 Sample No. | | | |
|---|---|---|---|---|
| | 19 | 20 | 21 | 22 |
| Linseed oil (parts by mass) | 0 | 7.5 | 15 | 35 |
| Surface state | Filler partially deposited | Favorable | Favorable | Partially uncured |

Example 4

To confirm heat cycle resistance of the curable resin composition of the present invention, a test specimen for evaluation of the tensile lap-shear strength was prepared by using the curable resin composition C sample No. 1 in the same manner as in Example 1, and the prepared test specimen was subject to a heat cycle test comprising repeatedly dipping the test specimen in liquid layers at −30° C. and 150° C. every 7 minutes by using a thermal shock tester (model: TSEL-2200-2, manufactured by ITEC Inc.). After 100, 500, 1,000, 2,000 and 3,000 cycles, the tensile lap-shear strength was measured in the same manner as in Example 1. The results are shown in Table 8.

Comparative Example 4

A spherical alumina-containing (meth)acrylic resin type liquid I was obtained, comprising 100 parts by mass in total of (meth)acrylate monomers, composed of 30% of bisphenol A epoxyacrylate, 60% of dicyclopentenyloxyethyl methacrylate and 10% of trimethylolpropane trimethacrylate, and 1.25 parts by mass of cumene hydroperoxide as an organic peroxide, 0.2 part by mass of 2-methylene-bis(4-methyl-6-tert-butylphenol) as a polymerization inhibitor, 2.5 parts by mass of γ-methacryloxypropyltrimethoxysilane as a silane coupling agent and 400 parts by mass of spherical alumina I as identified in Table 1. To the spherical alumina-containing acrylic resin type liquid J, as a decomposition accelerator for the organic peroxide, cobalt octanoate was added in an amount of 1.25 parts by mass per 100 parts by mass of the (meth)acrylate monomers to obtain a curable resin composition K (sample No. 23). The modulas in tension of the obtained curable resin composition K was 3,020 MPa. The curable resin composition K (sample No. 23) was subjected to a heat cycle test in the same manner as in Example 4. The results are shown in Table 8 together with the results in Example 4.

TABLE 8

| Heat cycle test* Cycles | | 0 cycle | 100 cycles | 500 cycles | 1,000 cycles | 2,000 cycles | 3,000 cycles |
|---|---|---|---|---|---|---|---|
| | | Tensile lap-shear strength (MPa) | | | | | |
| Ex. 4 | Sample No. 1 | 5.5 | 6.4 | 7.1 | 7.1 | 6.9 | 5.6 |
| Comp. Ex. 4 | Sample No. 23 | 12.3 | 1.2 | Separated | — | — | — |

*Heat cycle conditions: −40° C. ⇔150° C. (7 min each)

INDUSTRIAL APPLICABILITY

The curable resin composition of the present invention has fluidity and thereby is excellent in workability, and further, it provides a cured product which is flexible and has a low modulas, has high thermal conductivity to such an extent that heat generated from electronic components can be released, and has favorable heat cycle resistance. Accordingly, the curable resin composition can be applied to a potting material for sealing electronic components or an adhesive to be used for bonding heat spreaders or heatsinks in semiconductor packages. For such an application, it is advantageous in view of labor saving, energy saving and shortening of operation time and further, it is excellent in environmental resistance, and it is preferably applicable to this industrial field.

The invention claimed is:

1. A curable resin composition comprising a (meth)acrylate monomer, an organic peroxide, a decomposition accelerator for the organic peroxide, and an inorganic filler, wherein the inorganic filler has a particle size distribution such that it has peak diameters at least in the respective regions of from 3 to 10 μm and from 30 to 70 μm, and the mode diameter is from 30 to 70 μm and the median diameter is from 5 to 40 μm.

2. A curable resin composition comprising a (meth)acrylate monomer, an organic peroxide, a decomposition accelerator for the organic peroxide and an inorganic filler, wherein the inorganic filler has a particle size distribution such that it has peak diameters at least in the respective regions of from 0.2 to 1.5 μm, from 3 to 10 μm and from 30 to 70 μm, and the mode diameter is from 30 to 70 μm and the median diameter is from 5 to 40 μm.

3. The curable resin composition according to claim 1, which comprises from 0.5 to 10 parts by mass of the organic peroxide, from 0.1 to 10 parts by mass of the decomposition accelerator and from 100 to 1,500 parts by mass of the inorganic filler, respectively, per 100 parts by mass of the (meth)acrylate monomer.

4. The curable resin composition according to claim 1, which further contains a drying oil.

5. The curable resin composition according to claim 2, which further contains a drying oil.

6. The curable resin composition according to claim 4, which comprises from 1 to 30 parts by mass of the drying oil, from 0.5 to 10 parts by mass of the organic peroxide, from 0.1 to 10 parts by mass of the decomposition accelerator and from 100 to 1,500 parts by mass of the inorganic filler, respectively, per 100 parts by mass of the (meth)acrylate monomer.

7. The curable resin composition according to claim 1, wherein the inorganic filler is spherical alumina.

8. A cured product made of the curable resin composition as defined in claim 1.

9. A potting material made of the curable resin composition as defined in claim 1.

10. An adhesive made of the curable resin composition as defined in claim 1.

11. The curable resin composition according to claim 2, which comprises from 0.5 to 10 parts by mass of the organic peroxide, from 0.1 to 10 parts by mass of the decomposition accelerator and from 100 to 1,500 parts by mass of the inorganic filler, respectively, per 100 parts by mass of the (meth)acrylate monomer.

12. The curable resin composition according to claim 5, which comprises from 1 to 30 parts by mass of the drying oil, from 0.5 to 10 parts by mass of the organic peroxide, from 0.1 to 10 parts by mass of the decomposition accelerator and from 100 to 1,500 parts by mass of the inorganic filler, respectively, per 100 parts by mass of the (meth)acrylate monomer.

13. The curable resin composition according to claim 2, wherein the inorganic filler is spherical alumina.

14. A cured product made of the curable resin composition as defined in claim 2.

15. A potting material made of the curable resin composition as defined in claim 2.

16. An adhesive made of the curable resin composition as defined in claim 2.

17. The curable resin according to claim 1, wherein the (meth)acrylate monomer has at least one phenyl group.

18. The curable resin according to claim 2, wherein the (meth)acrylate monomer has at least one phenyl group.

19. The curable resin composition according to claim 1, wherein the inorganic filler has a particle size distribution such that it has peak diameters at least in the respective regions of from 3 to 10 μm and from 30 to 39.8 μm.

20. The curable resin composition according to claim 2, wherein the inorganic filler has a particle size distribution such that it has peak diameters at least in the respective regions of from 0.2 to 1.5 μm, from 3 to 10 μm and from 30 to 39.8 μm.

* * * * *